(12) United States Patent
Boyer et al.

(10) Patent No.: US 6,671,178 B2
(45) Date of Patent: Dec. 30, 2003

(54) MODULE HOUSING APPARATUS

(75) Inventors: Thomas Boyer, Gambrills, MD (US); Keith Chandler, Lawrenceville, GA (US); Lance Barley, Glen Burnie, MD (US); Melvyn Leeb, Owings Mills, MD (US)

(73) Assignee: Ciena Corporation, Linthicum, MD (US)

( * ) Notice: Subject to any disclaimer, the term of this patent is extended or adjusted under 35 U.S.C. 154(b) by 80 days.

(21) Appl. No.: 09/930,808

(22) Filed: Aug. 16, 2001

(65) Prior Publication Data

US 2002/0131241 A1 Sep. 19, 2002

Related U.S. Application Data

(60) Provisional application No. 60/242,067, filed on Oct. 20, 2000.

(51) Int. Cl.[7] ................................................. H05K 7/20
(52) U.S. Cl. ......................... 361/724; 361/801; 439/70; 165/80.3; 312/236
(58) Field of Search .................................. 361/724–727, 361/680–687, 800–801, 809, 816; 439/70, 327; 165/80.3; 312/236

(56) References Cited

U.S. PATENT DOCUMENTS

| 4,308,953 A | | 1/1982 | Cohen ........................ 206/334 |
| 5,375,724 A | | 12/1994 | Mazura ........................ 211/26 |
| 5,535,099 A | * | 7/1996 | McCarthy et al. ........... 361/800 |
| 5,583,750 A | | 12/1996 | Nakata et al. ............... 361/816 |
| 5,700,342 A | | 12/1997 | Giannetti ..................... 156/245 |
| 6,141,211 A | * | 10/2000 | Strickler et al. ............. 361/685 |
| 6,289,678 B1 | * | 9/2001 | Pandolfi ........................ 62/3.2 |
| 6,351,374 B1 | * | 2/2002 | Sherry ......................... 361/685 |

FOREIGN PATENT DOCUMENTS

| WO | 9315595 | 8/1993 | ............ H05K/7/14 |

OTHER PUBLICATIONS

PCT, "International Search Report".

* cited by examiner

*Primary Examiner*—Darren Schuberg
*Assistant Examiner*—Hung Van Duong
(74) *Attorney, Agent, or Firm*—Michael R. Cammarata

(57) ABSTRACT

A module housing apparatus protects modules having sensitive electrical, optical, and/or electro-optical components from physical and electrostatic discharge (ESD). The module housing apparatus includes a box constructed or coated with a conductive material and having an open end. Module board guides are formed in opposing inside surfaces of the conductive box and include slots that accept and guide the board edges of the module. The conductive module faceplate mates with the conductive box to form a Faraday cage that protects the components of the module from ESD. The module board guide may be modified to accept the module faceplate inner profile including, for example, a recess that accepts a module holding clip and/or an insertion guide to guide the board edges into the slot. A retaining mechanism such as a strap may be used to hold the module in the housing.

16 Claims, 10 Drawing Sheets

SECTION A-A

MODULE HOUSING APPARATUS

CROSS REFERENCE TO RELATED APPLICATION

The present application claims the benefit of the filing date of U.S. Provisional Application No. 60/242,067, filed Oct. 20, 2000, the teachings of which are incorporated herein by reference.

BACKGROUND OF THE INVENTION

1. Field of Invention

The invention relates to electrical and electro-optical module packaging designs. The invention more particularly relates to a module housing apparatus that temporarily houses an electrical or electro-optical module.

2. Description of Related Art

Electrical and electro-optical modules present difficult challenges to a packaging engineer. Such modules include one or more circuit boards with various electrical, optical, and/or electro-optical components. Such modules are quite fragile and should be adequately protected during shipping, servicing, or at an other time when the module is not located within a permanent or other protective container. The types of protection required by such modules include physical protection and ESD (electrostatic discharge) protection.

Many manufacturers of such modules utilize a permanent container to house sensitive boards having electrical, optical, and/or electro-optical components. For example, a common solution is to use a sheet metal housing to fully enclose the board(s).

While a sheet metal container does provide a measure of physical and electrostatic discharge (ESD) protection, such permanent containers create their own problems. Chief among these problems is heat dissipation. By enclosing the board(s) within a sheet metal container, thermal mass increases and, perhaps more significantly, airflow is restricted. Thus, the heat generated by the components is much harder to dissipate and may contribute to component failure, degradation and shortened life-span. Openings, holes and fans are often added to cool the components but such techniques are often inadequate and may lead to ESD problems.

Another problem of permanent containers is that they consume valuable space. A common goal in the electronics and opto-electronics industries is to produce modules of minimum size. The permanent container solution consumes space and defeats this goal. Moreover, the permanent container adds a level of complexity and cost to a module which can be a serious disadvantage in an industry having narrow profit margins.

Another common solution is to dispense with a permanent housing altogether. This creates shipping and temporary storage problems for the unprotected module. As noted above, the module is subject to physical damage as well as ESD damage from improper handling.

Various temporary module packing designs are commercially available to solve these problems. A typical design is a plastic clamshell enclosure in which two plastic panels with a common hinge may be closed in a clamshell fashion to house a module. The plastic panels usually have an cavity that conforms to the exterior dimensions of the module being housed. Such clamshell enclosures are quite flimsy and fail to adequately protect the module being housed. To provide the necessary physical protection such clamshell enclosures are themselves enclosed in other protective packaging materials particularly during shipping. This adds bulk, expense and may contribute to ESD problems particularly if electrically insulative packaging materials are used.

Suspension packaging is another conventional packing design widely used in the industry. Such suspension packages include two frames each of which holds a sheet of resilient material such as thin plastic. The module is put between the two frames which are then brought together thereby trapping the module between the resilient sheets. The space between the module and external box housing the frames provides a measure of physical protection but this measure may not adequate to protect the module. In addition, the plastic sheets and paper materials used are typically insulative and create ESD problems which can damage the components of the module.

Furthermore, suspension packaging is cumbersome and bulky and may not be utilized by a technician seeking a temporary home for the module. For example, such suspension packages are typically used only for shipping and are thrown away after shipping due to their bulk and not available for a temporary housing solution.

Therefore, there is a need for a module housing that solves the above-identified and other problems in the industry.

SUMMARY OF THE INVENTION

To achieve these and other objects of the invention, a module housing apparatus is disclosed for housing a module having at least one circuit board and a faceplate to which the circuit board is attached, including a box having an open end and a conductive outer surface; and a module board guide on an inside surface of the box, the module board guide having at least one slot along a longitudinal direction thereof, the slot being dimensioned to accept an edge of the circuit board of the module.

Although only one module board guide is necessary it is preferable to use a pair of the module board guides provided on opposing inside surfaces of the box, each of the module board guides having at least one slot along a longitudinal direction thereof, the slot being dimensioned to accept an edge of the circuit board of the module.

The module board guide may be an integral structure of the box or may include a pair of inserts attached to opposing inside surfaces of said box, each of said inserts having at least one slot along a longitudinal direction thereof, the slot being dimensioned to accept an edge of the circuit board of the module.

The module board guide may also have an insertion guide on a leading surface thereof facing the open end of said box and connected to said slot, the insertion guide guiding the edge of the circuit board into the slot.

Conductive materials such are preferably used to construct the box in order to have the desired Faraday cage effect. To complete the Faraday cage, the faceplate of the module is also preferably a conductive material.

Moreover, the leading edge of the module board guide may be shaped to accept the profile of the module. For example, the module board guide may be shaped to have a recess formed on a leading surface thereof facing the open end of the box, the recess dimensioned to accept a holding clip of the module faceplate.

Furthermore, the module board guide may have a plurality of slots along a longitudinal direction thereof, each of the slots being dimensioned to accept a corresponding edge of the circuit board of the module.

To further protect the module, a front resilient cap may be removably attached to the open end of the box and having an inside surface that substantially conforms to an outside surface of the module faceplate.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF INVENTION

The following detailed description of the invention refers to the accompanying drawings. The same reference numbers in different drawings identify the same or similar elements. Also, the following detailed description does not limit the invention. Instead, the scope of the invention is defined by the appended claims and equivalents thereof.

Figure 1:
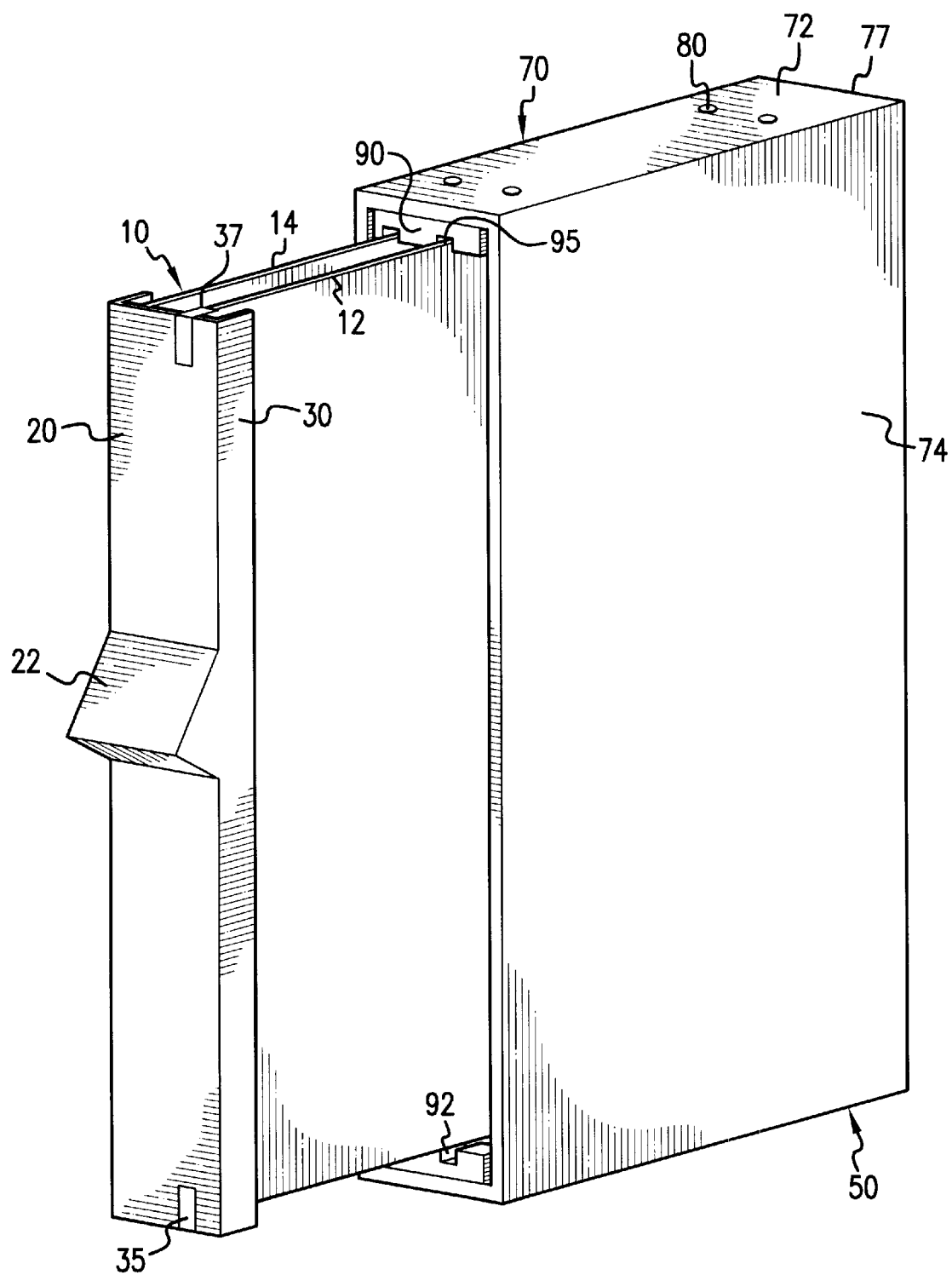
FIG. 1 is a perspective drawing showing the inventive module housing apparatus together with a typical module that may be housed with the invention.
Figure 2:
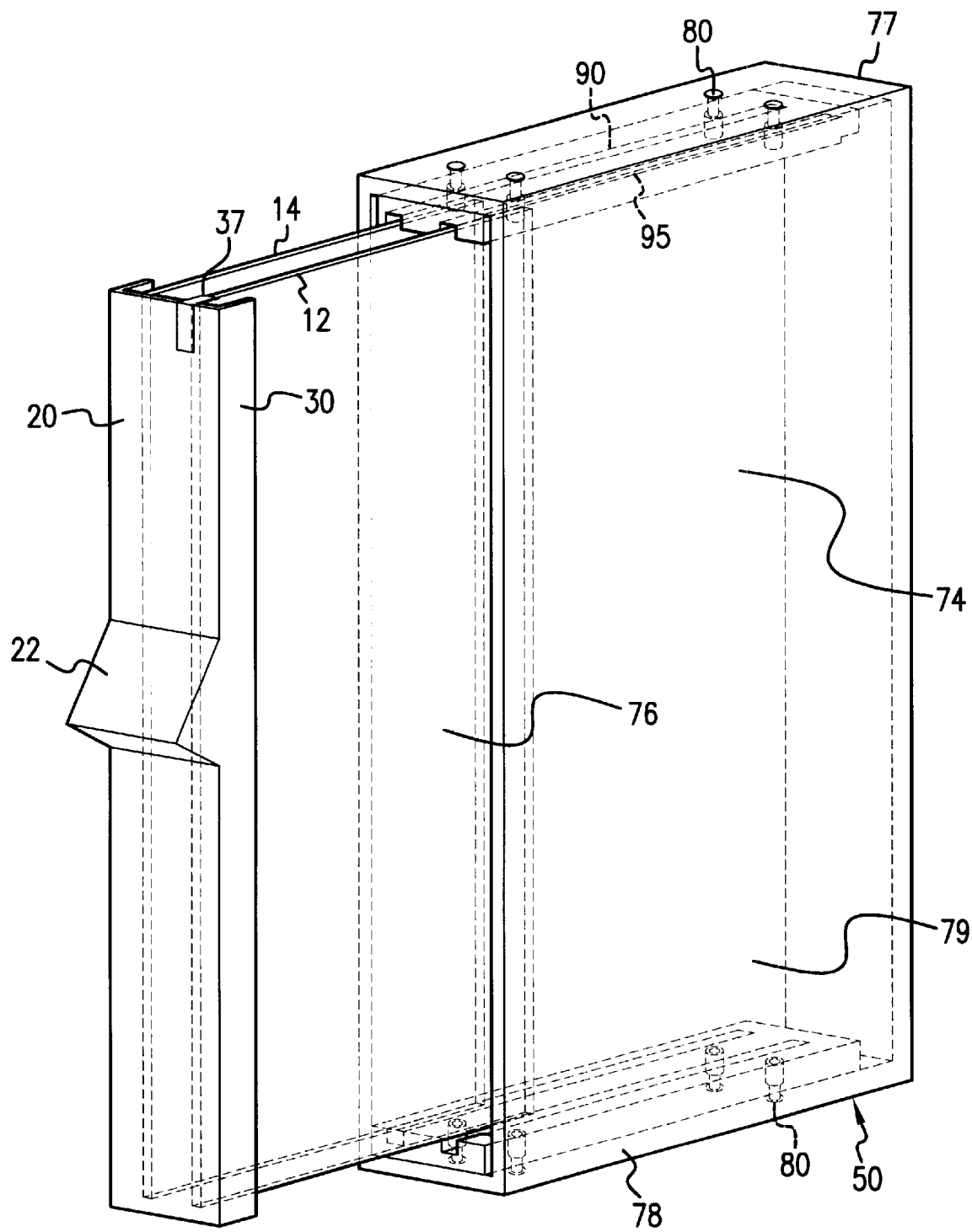
FIG. 2 is another perspective drawing showing internal parts of the inventive module housing using shadow lines together with a typical module that may be housed with the invention.
Figure 3:
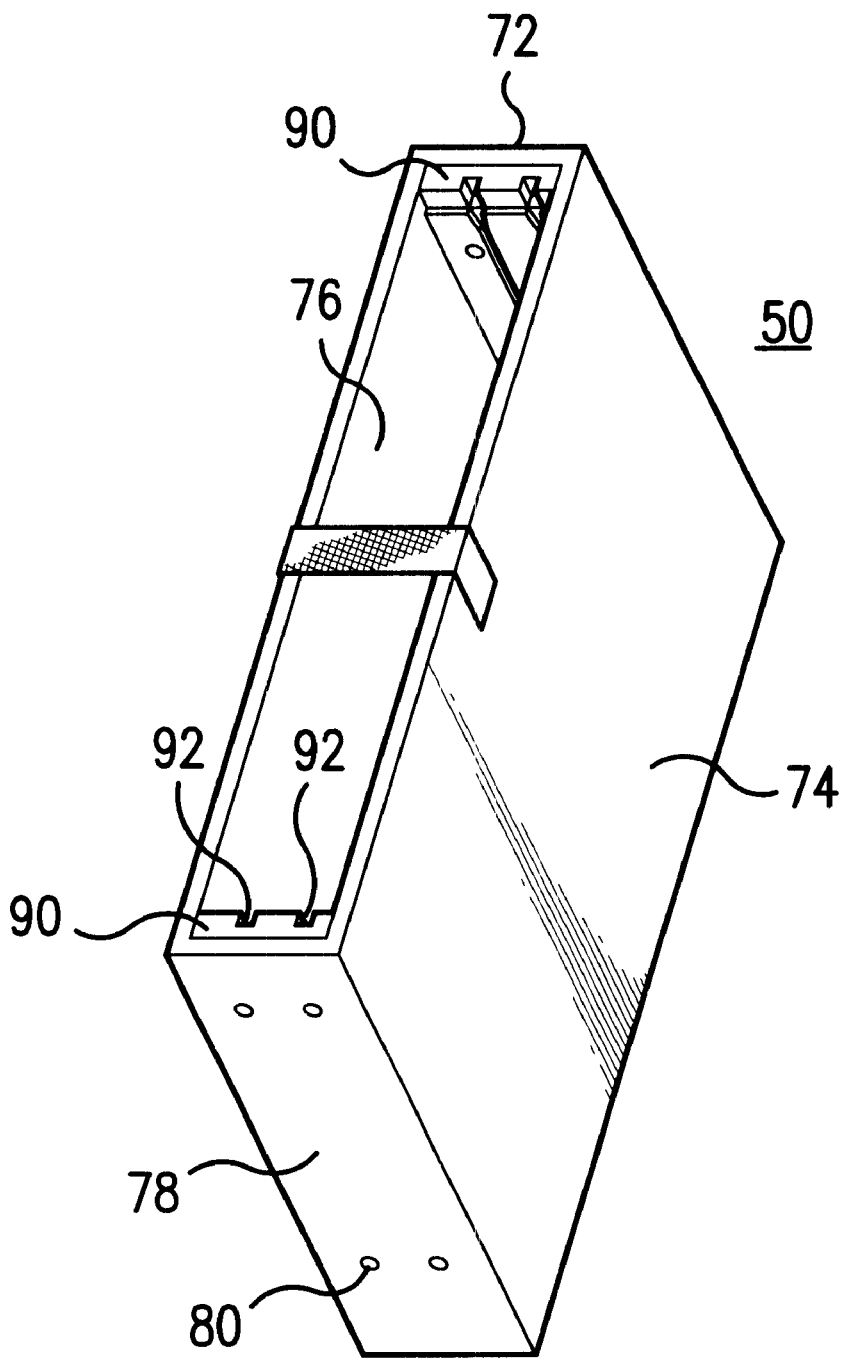
FIG. 3. is another perspective drawing from a different angle showing the inventive module housing apparatus without a module.

FIGS. 1–3 illustrate the inventive module housing apparatus 50 in perspective view. The module housing apparatus 50 may have a box-like shape as illustrated with left and right opposing sides 74, 79; a top side 72; a bottom side 78; an open end 76 and a back side 77.

The box-like or parallel piped shape is chosen to conform to the exterior shape of the module 10 being housed. For example, the module housing apparatus 50 illustrated in FIGS. 1–3 has a rectangular parallel piped exterior shape that conforms to the exterior shape of the particular module 10 illustrated.

It is to be understood that the shape of the module housing apparatus 50 may be adapted as known in the art to the exterior shape of the particular module 10 to be housed. This includes adapting the relative dimensions of the sides 74, 79, 72, 78 and 76 as well as the overall shape and dimensions of the module housing apparatus 50.

Moreover, the module 10 illustrated in FIGS. 1 and 2 happens to have two boards 12 and 14. It is also to be understood that the module 10 to be housed and the corresponding elements of the module housing apparatus 50 may change. For example, the number of boards may be one board, three boards, four boards or any number of boards designed into the module. Furthermore, the board pitch (distance between boards 12 and 14) may also vary and the invention may be adapted to such board pitch variations by changing the pitch of the slots 92.

Furthermore, the boards 12, 14 include one or more components such as integrated circuit chips, discrete electrical components, optical components such as Bragg gratings, optical fiber, connectors, opto-electric components such as lasers or any other electrical, optical or electro-optical components.

Furthermore, one or more of the boards, such as board 14 may be a heat sink, structural member, connector plane, or other component. Preferably, the boards 12, 14 have flat edge at a top and/or bottom portion thereof (with top and bottom having an orientation as defined in FIGS. 1 and 2).

The module housing apparatus 50 further includes a module board guide 90 which is essentially set of slots 92, one slot 92 for each board (12 or 14). The module 10 shown in FIGS. 1 and 2 happens to have two boards 12, 14 so the board guide 90 has two corresponding slots 92. As mentioned above, the module 20 may have only one board which means that the module board guide 90 would only need to have one slot 92 as discussed below in relation to FIGS. 9 and 10.

Although it is preferable to have two module board guides 90 (one opposing inside surfaces of the housing 50), it is possible to have only one such guide 90 mounted an inside surface of, for example, the top or bottom surface 72, 78 of the module housing apparatus 50.

The module board guide 90 may be made in a variety of ways. One such way is includes a block of material (e.g. Teflon or plastic) machined, injection molded or otherwise fashioned to include slots 92 that accept the edges of boards 12, 14. Preferably, the slots are dimensioned to be slightly larger than the edges of the boards 12, 14. If the boards 12, 14 have an equal thickness, then the slots would have an equal width. Of course, the board thickness and corresponding slot width may be adjusted to accommodate the particular module 10 design.

Figure 4:
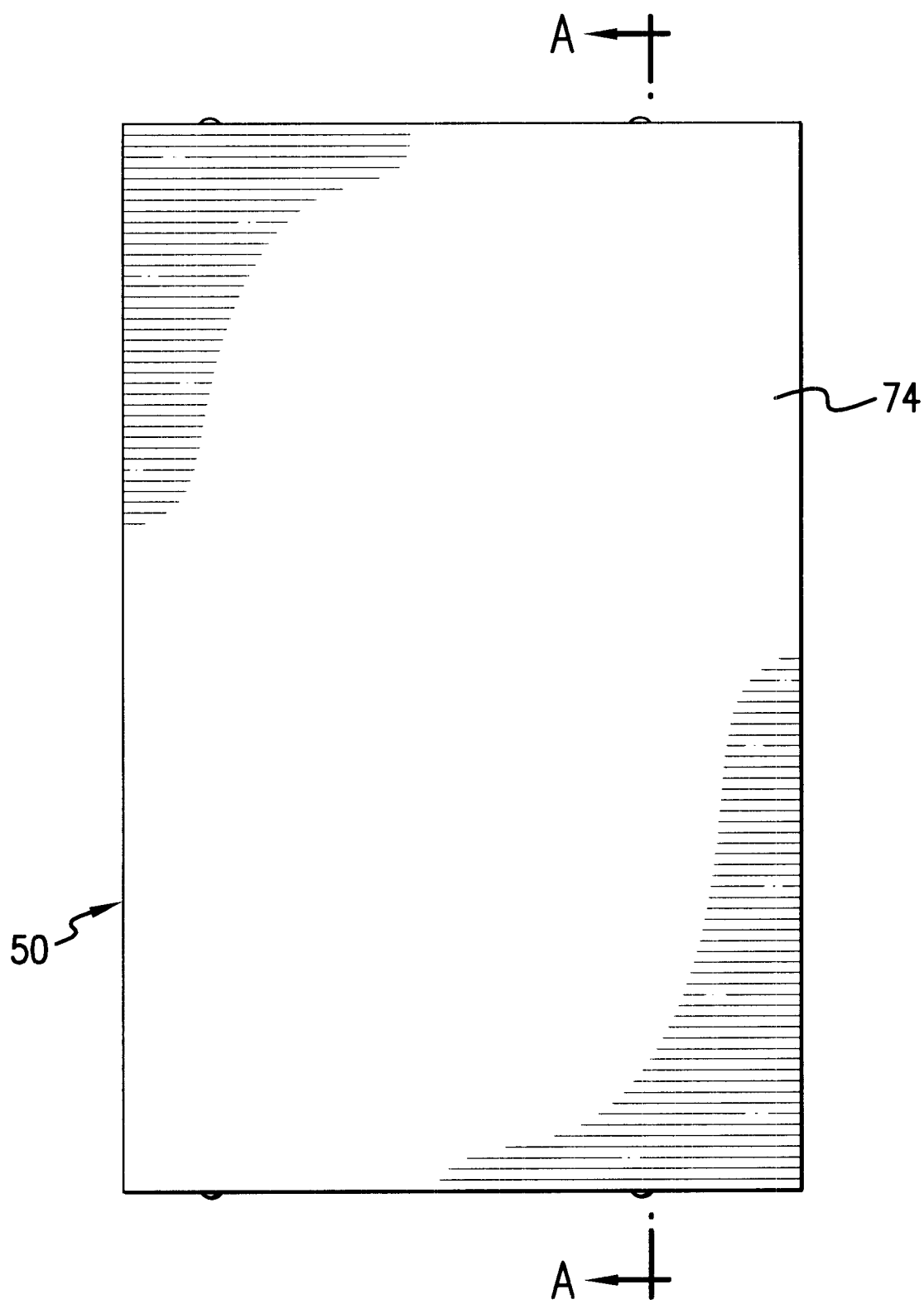
FIG. 4 is a side view of the inventive module housing apparatus and showing a cross section line A—A.
Figure 5:
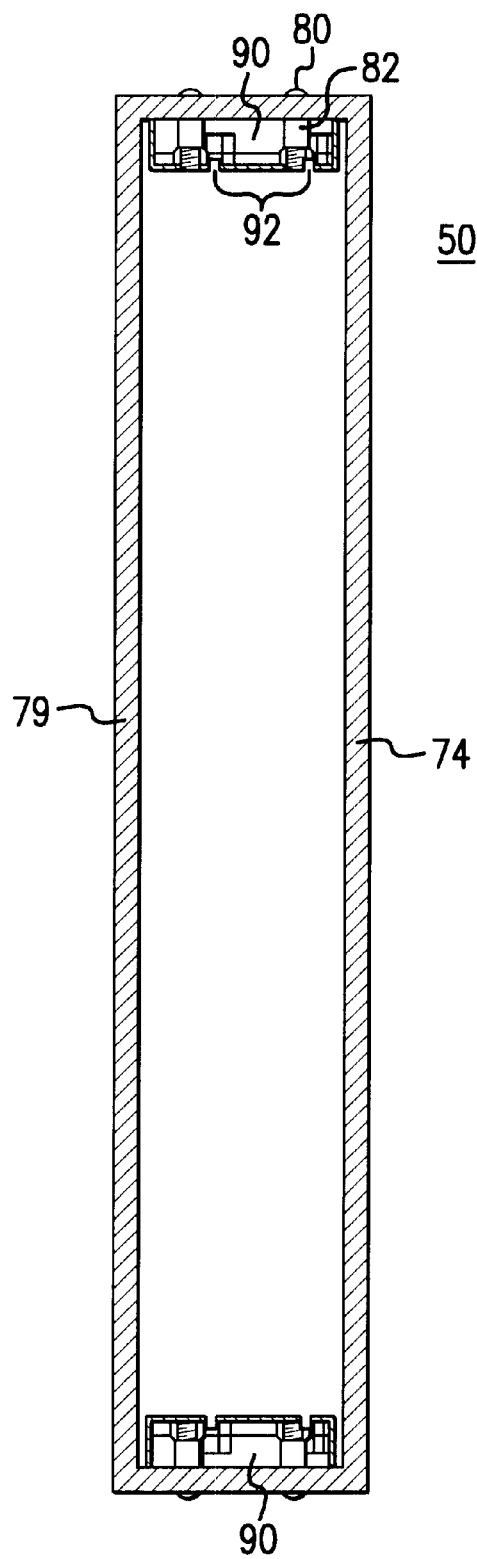
FIG. 5 is a cross sectional view of the module housing apparatus along cross section line A—A.
Figure 6:
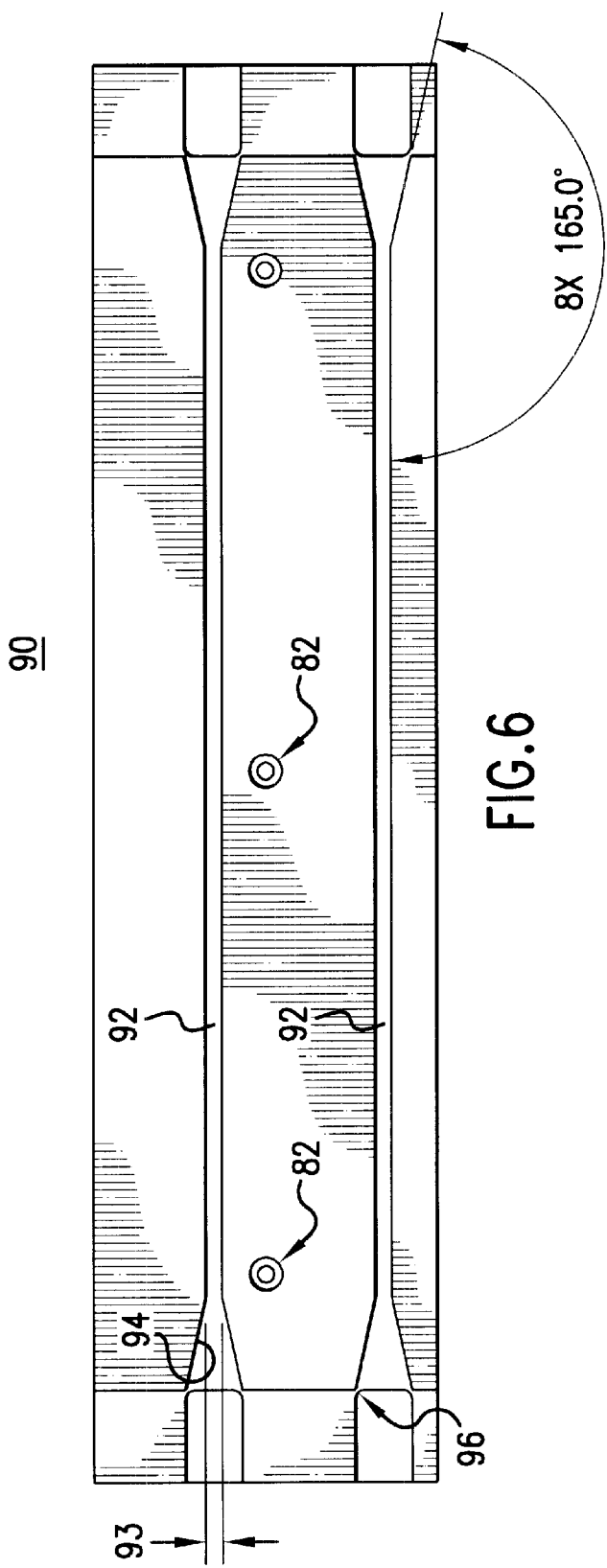
FIG. 6 is a top view showing a first embodiment of the inventive module board guide.

FIGS. 4–6 illustrate the preferred embodiment of the module board guides 90. Specifically, FIG. 5 illustrates the module housing apparatus 50 and module board guides 90 in cross section along cross section line A—A (see FIG. 4). As shown therein, the module board guide 90 is essentially a block of material in which slots 92 are formed that accept the edges of boards 12 and 14 of the module. The module board guide 90 may be attached to the module housing apparatus 50 with fasteners 80 that attach via holes 82. Of course, other means of fastening are contemplated by the invention and within the scope of the claims.

Figure 7:
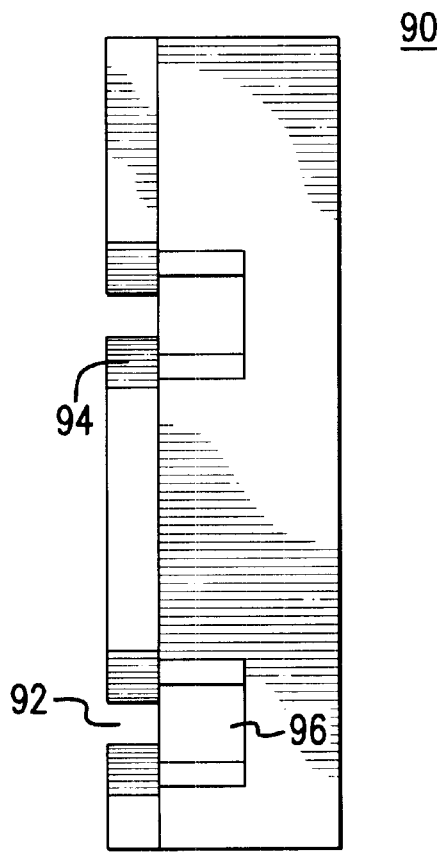
FIG. 7 is an end view showing a first embodiment of the inventive module board guide.

FIGS. 6 and 7 illustrate other aspects of the preferred module board guide 90. Namely, insertion guides 94 are preferably formed in the leading edge of the slots 92. The insertion guides 94 may be formed by flaring out or otherwise tapering the width 93 of the slots 92 in an outward direction. The insertion guides aid the insertion of the module 10 into the module housing apparatus 50 by guiding the edges of boards 12, 14 into the slots 92.

FIGS. 6 and 7 also show a holding clip recess 96 which may be necessary depending upon the particular module 10 expected to be housed in the module housing apparatus 50. In other words, some modules 10 utilize a holding clip (not shown) to hold the module 10 in, for example, an equipment rack. When the module 10 is inserted into the module housing apparatus 50, such holding clips may interfere with the module board guide 90 and prevent full insertion. The holding clip recess 96 permits modules 10 having such holding clips to be fully inserted into the module housing apparatus 50 to complete the Faraday cage.

Another alternative is to use the holding clip (if present on a module 10) to hold the module 10 in the module housing apparatus 50. The holding clip recess 96 may be modified to accept the holding clip or a holding clip receiving device may be added to perform this function. Instead of using the holding clip, a strap or other retaining device may be added to the module housing apparatus. For example, a pair of Velcro straps could be attached to the left and right sides 79, 74 that span the open end 76 of the module housing apparatus 50. If such Velcro straps are used, then they would preferably be made from a conductive material as further discussed below.

Figure 8:
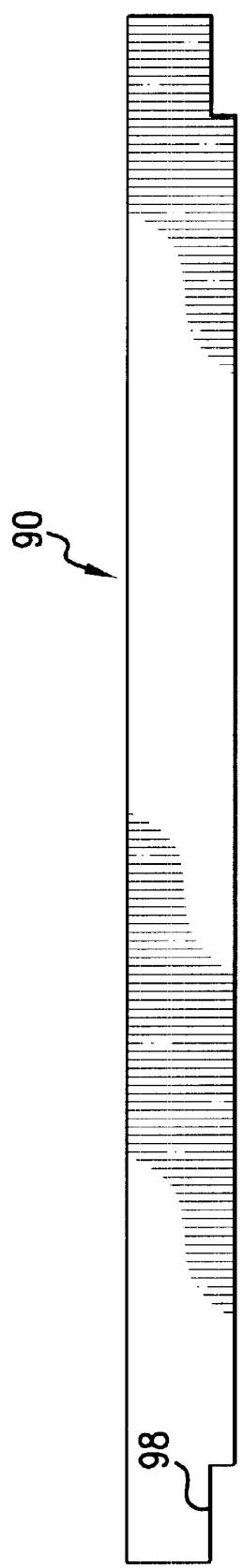
FIG. 8 is a side view showing a first embodiment of the inventive module board guide.

As another alternative, the profile of the leading edge (or other portions) of the module board guide 90 may be formed to mate with or otherwise accept protruding structures of the particular module 10 to be housed that would otherwise prevent full insertion of the module 10 into the module housing apparatus 50. FIG. 8 is an example of such alternatives. FIG. 8 is a side view of a module board guide 90 and shows a step-like profile 98 that is intended to accept a corresponding step-like profile of the particular module 10 to be housed. This profile 98 may be modified or eliminated entirely depending upon the particular structure of the module 10 to be housed.

The illustration of FIG. 6 shows a left-right symmetrical structure in which insertion guides 94 and the holding clip recesses 96 are provided on both ends of the module board guide 90. Such symmetry is not necessary as the insertion guides 94 and the holding clip recesses 96 need only be provided on the leading edge of the module board guide 90 facing the open end 76 of the module housing apparatus 50. This symmetry, however, increases the efficiency of the manufacturing and assembly process of the module housing apparatus and such symmetry is shown for that reason. Specifically, identical module board guides 90 may be manufactured and installed in the top and bottom of the housing 50 with one guide 90 being flipped end for end relative to the other to assemble a complete housing 50.

If the module board guide 90 is a separate piece such as the fashioned block shown in FIGS. 5–8, then it should be attached to the inside surface of the top and bottom sides 72, 78 of the module housing apparatus 50. The attachment may be made in a variety of ways such as, for example, the fasteners 80 shown in the figures or with an adhesive.

The module board guide 90 may also be an integral component of the module housing apparatus 50. For example, the top and bottom sides 72, 78 may be fashioned to include slots or grooves that comprise the module board guide 90.

Figure 9:
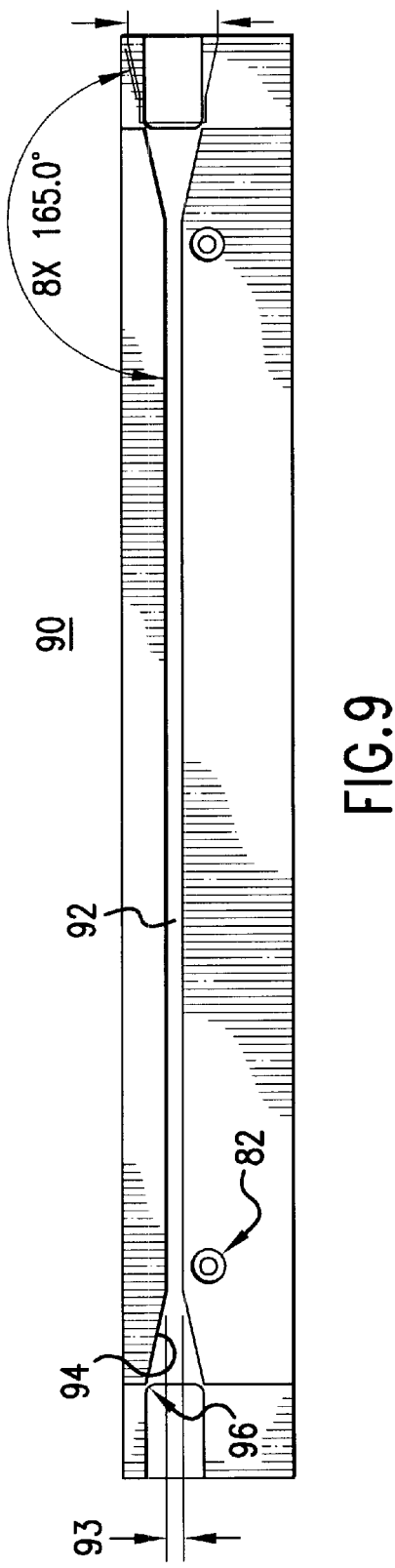
FIG. 9 is a top view showing a second embodiment of the inventive module board guide.
Figure 10:
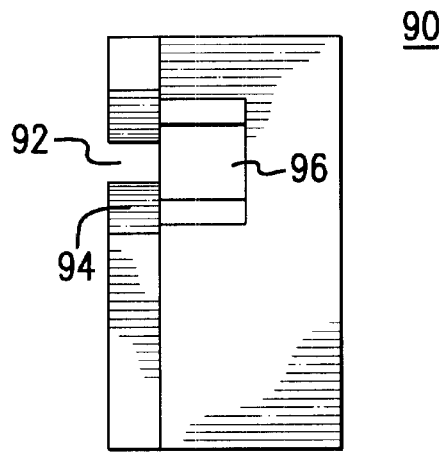
FIG. 10 is an end view showing a second embodiment of the inventive module board guide.

FIGS. 9 and 10 show another alternative of the module board guide 90 that was briefly mentioned above. Namely, the module board guide 90 may be constructed with any number of slots 92 to accommodate the number of boards (e.g. boards 12 and 14) in the module 10. FIGS. 9 and 10 show the case in which the module 10 has only one board. FIGS. 9 and 10 are quite similar to FIGS. 6 and 7 and show the module board guide 90 having a single slot 92 of width 93 corresponding to the width of the expected module 10 board. FIGS. 9 and 10 also show the preferred board guide 94 structure and optional holding clip recess 96.

To use the module housing apparatus 50, the module 10 is simply slid into the module housing apparatus 50 by first aligning the boards 12, 14 with the corresponding slots 92 of the module board guide 90 and then sliding the module 10 into the module housing apparatus 50. If the module housing apparatus 50 is not symmetric such as when the spacing between the boards 12, 14 and the outer edges of the module 10 is not symmetric (e.g. as shown in FIGS. 6 and 9) then care should be taken to ensure that the module housing apparatus 50 is correctly oriented relative to the module 10.

The above-described construction of the module housing apparatus 50 physically protects the module 10 from damage. If physical protection is sufficient for the module, then process of selecting appropriate materials to construct the module housing apparatus 50 is simplified. For example, the module housing apparatus 50 may be constructed with corrugated paper or cardboard. The module board guide 90 may be constructed with corrugated paper or various plastic materials.

The preferred embodiment, however, provides ESD protection in addition to physical protection. Thus, the material selection process is more challenging. For example, the module housing apparatus 50 should be made with a conductive material such as conductive fiberboard, conductive cardboard, conductive plastic or insulative materials coated with a conductive material. The aim is to form a Faraday cage around the module 10 to protect the module 20 from ESD. To that end, a typical module 10 has a conductive faceplate 20 made of, for example, sheet metal.

The faceplate may also include conductive sides 30 that preferably make electrical contact with the inside surface of the right and left sides 74, 79 of the module housing apparatus 50. To aid in this connection, conventional finger clips are typically provided on the faceplate sides 30 which are originally intended to make electrical contact with the module's permanent housing. Such finger clips (not shown) can also be used by the invention to make electrical contact with the inside surface of the right and left sides 74, 79 of the module housing apparatus 50.

It is also preferable for the bottom and top edges of the faceplate 20 make electrical contact with a surface of the module housing apparatus 50 to complete the Faraday cage.

In general, the surfaces of the module housing apparatus 50 that mate with the faceplate 10 are preferably constructed with a conductive material or coated with a conductive material to improve the Faraday cage effect.

Another alternative is to utilize a cap 100 to cover the faceplate 20 of the module 10 when it is fully inserted into the module housing apparatus 50. Such a cap 100 would preferably form fit or otherwise be adapted to the outside shape of the faceplate. The cap 100 would provide an additional measure of protection for the module 10.

Figure 11:
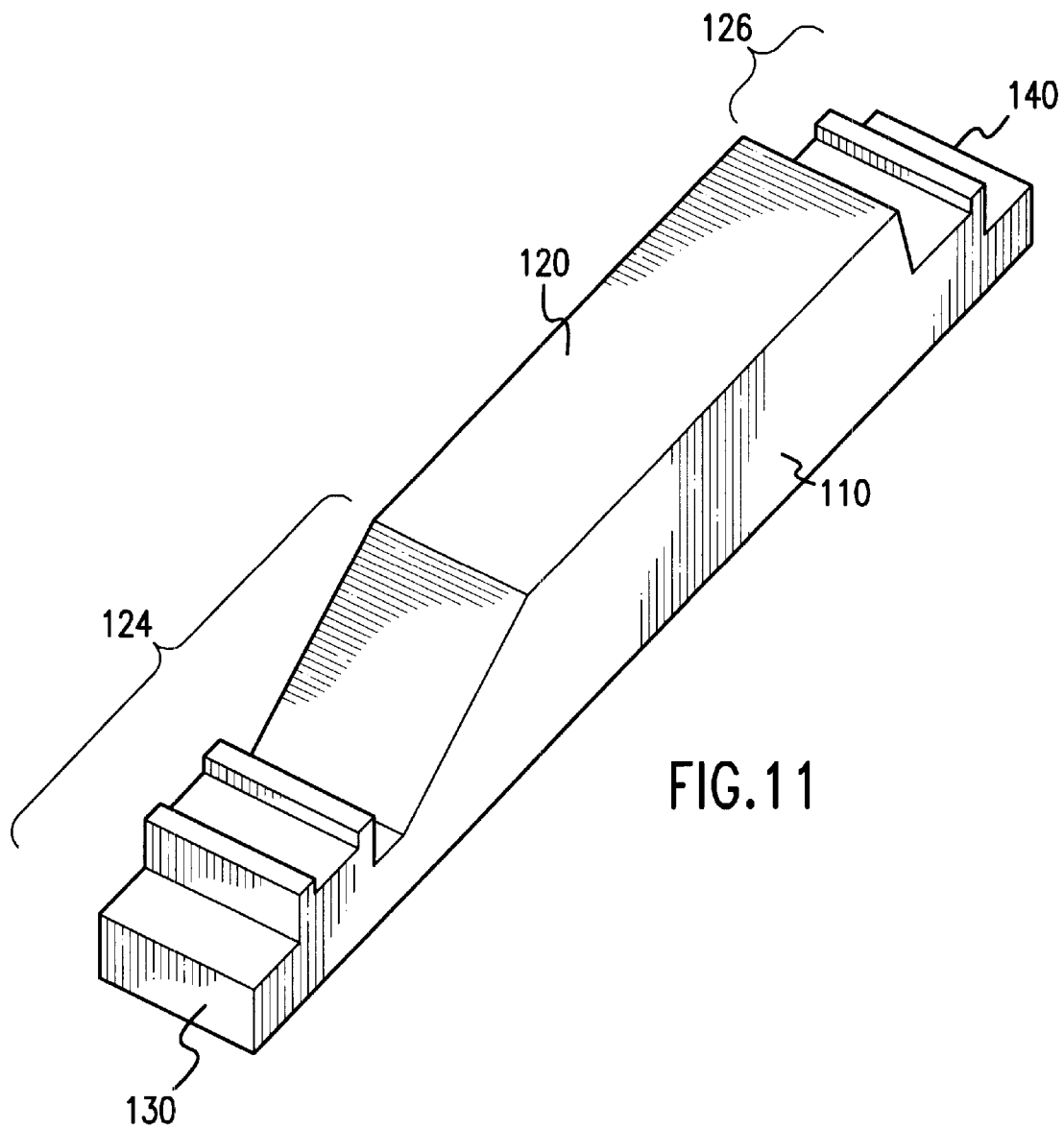
FIG. 11 is a perspective view of an optional end cap according to the invention.
Figure 12B:
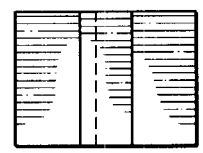
FIG. 12b is an end view of the optional end cap according to the invention.
Figure 12A:
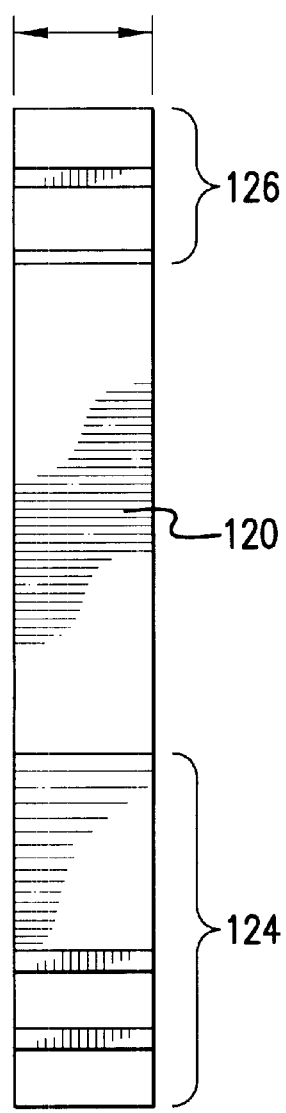
FIG. 12a is a top view of the optional end cap according to the invention.
Figure 12C:
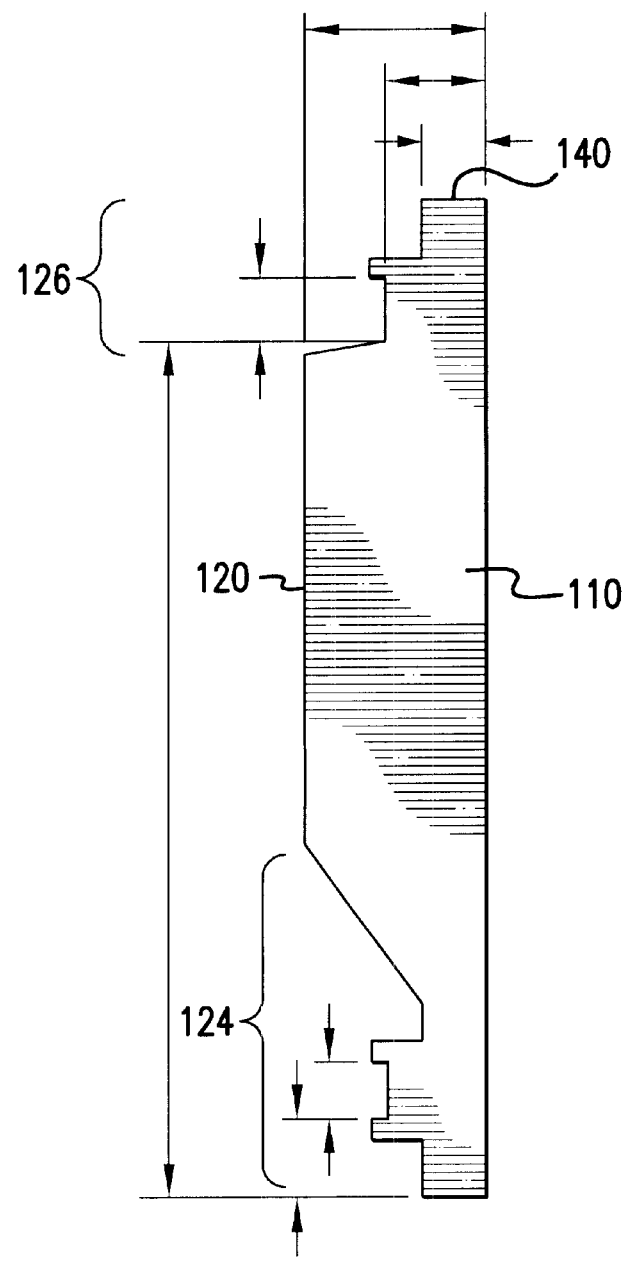
FIG. 12c is a side view of the optional end cap according to the invention.

FIGS. 11 and 12a–c illustrate one non-limiting example of cap 100. FIG. 11 shows the cap 100 in perspective view while FIGS. 12a–c show cap 100 in top, side, and end views, respectively. As shown therein, cap 100 may have sides 110; ends 130, 140; and a top 120. There is no bottom portion as the cap 100 is intended to slide over and cover the outside portion of the faceplate. Portions 124 and 126 are shaped to adapt to the outside shape of the faceplate. As the faceplate shape may vary, so may the portions 124 and 126 as well as other portions of the cap 100. The cap 100 may be made from a variety of materials such as plastic but a conductive material would further enhance the ESD protection factor.

To further protect the module 10, foam or other resilient materials are preferably attached to the inside surface of the back wall 77. Such a resilient material would help protect the module 10 from physical damage. If the resilient material on the inside surface of the back wall 77 were made with a conductive material then an additional measure of ESD protection would be provided as well.

To prove the inventive concepts described above, the inventors constructed a prototype module housing apparatus 50 subjected the prototype to ESD testing. Before discussing the results of this testing, a brief background on ESD will be presented.

When packaging an ESD sensitive item for transportation, storage, or final shipment outside of "ESD protected areas" two forms of protection are desirable as follows.

Protection from triboelectric charges: The ESD sensitive item should not build up a static charge due to sliding on the packaging material resting up against it in the packaging scheme (triboelectric charging). "Antistatic" materials may be used to provide this "non-charging" function. Antistatic materials, however fail to significantly protect against external static fields (e.g., static fields that penetrate through antistatic materials). Such external fields can induce a charge on the product inside of the antistatic packaging and cause the product therein to become charged. Antistatic materials typically do not provide shielding protection.

Protection from External Fields (Shielding Protection): Only conductive materials provide shielding protection. However, conductive materials may cause the ESD item to become charged if it slides across it (i.e., conductive materials are not necessarily "antistatic" in nature, although some indeed do have excellent antistatic properties as well).

Consequently, the inventive packaging scheme makes use of both forms of protection. For example, the invention creates the desired Faraday Effect (which causes external fields to be shielded from the product) with a substantially complete covering of the product.

In contrast, a serious packaging liability would exist if full shielding were not accomplished. Specifically, external fields can penetrate (via induction) to the product inside and cause the product to become charged. Personnel opening such a packaging will cause a discharge (and subsequent ESD damage) the instant they touch the product.

By using the module housing apparatus 50 as a protective housing, the module (an ESD sensitive item) is enclosed in a conductive cardboard container that completely surrounds the ESD item (the components of the module 10). The module 10 slides into the module housing apparatus 50 via slide rails grooved into module board guide 90 (e.g. made of Teflon pieces adhered onto two inside walls (72, 78) of the housing 50 in the prototype design).

By completely installing the module 10 into the conductive housing 50, the metal faceplate 20 completes the desired "full Faraday cage". The actual measurements detailed below show that the Faraday shielding protection is excellent. Moreover, the small gaps or openings at the top and bottom of the housing (between the faceplate 20 and the housing) do not compromise the shielding protection.

Moreover, there are no charging issues during insertion of the module 10 into the housing 50. Still further the tests show that no static fields were available from any source (either inside or outside the housing 50) that would cause potential field induction problems for the module 10.

In the prototype, the fasteners 80 were constructed from ordinary, high charge generating plastic. If this material is used, then it will be important that operators keep the exposed modules 10 from contacting those pieces on the outside of the housing. To prevent this from happening, the fasteners 80 (if used) should be constructed with non-charge generating alternatives such as a variety of available plastic materials designed for this purpose.

During the test, the materials used to construct the prototype housing 50 were evaluated. As shown in the Table 1 below, the conductive cardboard used for the housing 50 is a great shielding material and is also very low in charge generation. It is an excellent choice for the shielding requirement for this type of ESD protective housing. Furthermore, the foam insert at the rear bottom inside surface 77 of the housing 50 is also an excellent antistatic material because no charging of the module 50 was observed.

If Teflon is used for the module board guide 90 or if insulative Velcro strips are used as a retaining mechanism then such high charge generating materials may create an ESD problem. Options to resolve this problem include using, for example, conductive plastic or conductive cardboard to construct the module board guide 90 and using conductive Velcro strips or other conductive materials to construct a retaining device. As another option if such materials are not used, operators should not be allowed to place unprotected modules 10 on any outside surface of the housing 50 bearing such materials.

The shielding effect of the housing 50 was also evaluated. When the module 10 is completely inserted into the housing 50, excellent shielding protection was observed. This shielding is facilitated by the faceplate 20 being constructed from a conductive material such as metal and constructing the housing 50 with a conductive material or having a conductive coating thereon. The experiments that were conducted included placing ESD sensor at various locations inside the module housing 50 to observe if 20 Kv generated fields could penetrate through during normal usage. No voltage penetration (the sensors used fired at fields of 20 volts or greater) when external (very large) static fields were applied. This is indicative that an excellent Faraday cage is indeed in place with this design. The small gaps at the top (open) end of the module housing 50 are not enough to affect the shielding integrity.

Experiments were also performed to insure sufficient suppression of internal potential charging. There was a potential risk due to the use of Teflon for the module board guides 90 in the prototype. Specifically, the potential problem would be that this high charge generating Teflon material would become highly charged when rubbed by the module 10 during insertion. Such a charge would induce a field in the components of the module 10 board assembly and possibly cause damage in that fashion.

The Teflon material, when not a part of the housing 50, generates substantial charges as seen in Table 1. However, testing reveals that the risk posed by this charge is negligible. The reason is that the Teflon module board guide 90 is located inside the housing 50. The result is that the charging from the module insertion is becomes suppressed by the surrounding conductive housing 50 material . . . and presents no measurable problem therefore. It would be acceptable to use this Teflon material for the module board guide 90 as there was no measurable ESD risk detected.

Experiments did reveal, however, a slight risk if insulative materials are used on the outside of the housing 50. Specifically, an insulative Velcro retaining strap was used which creates a possible, potential ESD risk. these materials generate substantial static charges (see Table 1). These Velcro material used was thick enough to overcome suppression from the housing 50 and pose a potential threat to ESD sensitive items that may come into close proximity to them. Again, it is noted that fields from these retainer did not penetrate through to the components of modules 10 after insertion into the housing 50. The risk is to the modules 10 is only present if they are placed on top of the housing 50. Nevertheless, this risk very small and may be acceptable depending upon the particular module 10 being housed. This risk could also be eliminated by using a conductive material for the retaining device or by eliminating the retaining device entirely.

The ESD testing that was performed included the following tests:
1. "SR-30V": Surface Resistivity; using a Voyager™ SRM-110 30 volt probe. (Units are in Ω/Sq.)
2. "SR-100V": Surface Resistivity; using a Megger™ 100-volt probe.
3. "SR-500V": Surface Resistivity; using a Megger™ 500-volt probe
4. "Charge-Rub": Charge generated on the sample after gentle rubbing by hand (measured with an NRD-512 Static Fieldmeter).
5. "Charge-PCB": Charge generated onto typical PC board materials when rubbed with the sample under test (measured with fieldmeter)
6. "Charge-IC": Charge generated onto an IC when the IC was slid across the sample under test and dumped into a Voyager™ PVT-100 Faraday Cup to measure the charge.
7. "Shielding": Charge observed on product inside the packaging material when a 20 KV charged material is brought directly against the outside (measured with special charge measuring equipment—a small probe is placed next to the product inside the packaging).

During the test, twenty-five readings were taken for each sample, and they are given (EIA standard method) are summarized below in Table 1. To simulate worst case conditions, all samples were "cured" for 24 hours at 10% relative humidity (RH), then tested at 10% RH.

not to be regarded as departure from the spirit and scope of the invention, and all such modifications as would be obvious to one skilled in the art are intended to be included within the scope of the following claims.

What is claimed is:

1. A temporary module housing apparatus for temporarily housing a module having at least one circuit board and a conductive faceplate to which the circuit board is attached, comprising:
   a box constructed with conductive cardboard or cardboard coated with conductive material, said box having an open end and a conductive outer surface; and
   a module board guide on an inside surface of said box, said module board guide having at least one slot along a longitudinal direction thereof, said slot being dimensioned to accept an edge of the circuit board of the module.

2. The temporary module housing apparatus according to claim 1,
   a pair of said module board guides provided on opposing inside surfaces of said box, each of said module board guides having at least one slot along a longitudinal direction thereof, said slot being dimensioned to accept an edge of the circuit board of the module.

3. The temporary module housing apparatus according to claim 1,
   said module board guide including a pair of inserts attached to opposing inside surfaces of said box, each of said inserts having at least one slot along a longitudinal direction thereof, said slot being dimensioned to accept an edge of the circuit board of the module.

4. The temporary housing apparatus according to claim 1, wherein said module board guide is an integral structure of said box.

5. The temporary module housing apparatus according to claim 1,
   said module board guide having an insertion guide on a leading surface thereof facing the open end of said box and connected to said slot, said insertion guide guiding the edge of the circuit board into said slot.

6. The temporary module housing apparatus according to claim 1, further comprising:
   a resilient pad attached to an inside surface of said box opposite to the open end.

7. The temporary module housing apparatus according to claim 1,
   said module board guide having a recess formed on a leading surface thereof facing the open end of said box, said recess dimensioned to accept a holding clip of the module faceplate.

TABLE 1

| Sample Description | SR-30V | SR-100V | SR-500V | Charge | Charge-PCB | Charge-IC | Shielding |
|---|---|---|---|---|---|---|---|
| Conductive Cardboard Housing 50 | 105 | 105 | 105 | 0v | <20v | <20v | Yes-0v |
| Teflon Module Board Guides 90 | >1012 | >1012 | >1012 | 20Kv | 15Kv | 15Kv | No . . . Insulator |
| Velcro Retraining Strap | >1012 | >1012 | >1012 | 10Kv | 12Kv | 12Kv | No . . . Insulator |
| Antistatic Foam | 109 | 108 | 108 | 0v | 0v | 0v | No . . . Antistatic |

The invention being thus described, it will be obvious that the same may be varied in many ways. Such variations are 8. The temporary module housing apparatus according to claim 1, further comprising:

a retaining device attached to said box, said retaining device retaining the module in the module housing apparatus.

9. The temporary module housing apparatus according to claim 1, further comprising:

said module board guide having a plurality of slots along a longitudinal direction thereof, each of said slots being dimensioned to accept a corresponding edge of the circuit board of the module.

10. The temporary module housing apparatus according to claim 1, further comprising:

a front cap removably attached to the open end of said box and having an inside surface that substantially conforms to an outside surface of the module faceplate.

11. The temporary module housing apparatus according to claim 1, wherein at least one inside surface of said box is conductive.

12. The temporary module housing apparatus according to claim 1, wherein said module board guide is constructed with a conductive material.

13. The temporary module housing apparatus according to claim 1, further comprising:

conductive fasteners attaching said module board guide to said box.

14. The temporary module housing apparatus according to claim 1, wherein the open end of said box includes left and right conductive inside surfaces that make electrical contact with conductive sides of the faceplate so as to complete a Faraday cage around a single module.

15. A module housing apparatus for housing a module having at least one circuit board and a faceplate to which the circuit board is attached, comprising:

a box having an open end and a conductive outer surface; and a module board guide on an inside surface of said box, said module board guide having at least one slot along a longitudinal direction thereof, said slot being dimensioned to accept an edge of the circuit board of the module, said module board guide having a second insertion guide on a trailing surface thereof facing away from the open end of said box and connected to said slot.

16. A module housing apparatus for housing a module having at least one circuit board and a faceplate to which the circuit board is attached, comprising:

a box having an open end and a conductive outer surface; and a module board guide on an inside surface of said box, said module board guide having at least one slot along a longitudinal direction thereof, said slot being dimensioned to accept an edge of the circuit board of the module, a retaining strap having two ends attached to opposing outer surfaces of said box, wherein at least one of the strap ends is removably attachable to the respective outer surface of said box; said retaining strap spanning the open end of said box when attached to said box to retain the module in the module housing apparatus.

* * * * *